(12) United States Patent  
Ishibashi et al.

(10) Patent No.: US 9,899,564 B2
(45) Date of Patent: Feb. 20, 2018

(54) GROUP III NITRIDE SEMICONDUCTOR AND METHOD FOR PRODUCING SAME

(71) Applicant: Panasonic Intellectual Property Management Co., Ltd., Osaka (JP)

(72) Inventors: Akihiko Ishibashi, Osaka (JP); Akio Ueta, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/431,721

(22) Filed: Feb. 13, 2017

(65) Prior Publication Data
US 2017/0279003 A1   Sep. 28, 2017

(30) Foreign Application Priority Data

Mar. 23, 2016 (JP) .................. 2016-057973
Nov. 16, 2016 (JP) .................. 2016-223291

(51) Int. Cl.
*H01L 21/02* (2006.01)
*H01L 29/20* (2006.01)
(Continued)

(52) U.S. Cl.
CPC ........ *H01L 33/007* (2013.01); *H01L 21/0254* (2013.01); *H01L 29/2003* (2013.01); *H01L 31/1852* (2013.01)

(58) Field of Classification Search
CPC ............. H01L 21/0254; H01L 29/2003; H01L 33/007; H01L 31/1852
See application file for complete search history.

(56) References Cited

U.S. PATENT DOCUMENTS 4,177,321 A   12/1979   Nishizawa
6,656,615 B2 *  12/2003  Dwilinski; Robert Tomasz ............... C30B 7/00
                                                              117/952
(Continued)

FOREIGN PATENT DOCUMENTS

JP   49-033556 A   3/1974
JP   61-234547 A   10/1986
(Continued)

OTHER PUBLICATIONS

Miskys et al., "Freestanding GaN-substrates and devices", Aug. 2003, phys. stat. sol. (c) 0 No. 6, pp. 1627-1650.*
(Continued)

*Primary Examiner* — Evan Pert
(74) *Attorney, Agent, or Firm* — McDermott Will & Emery LLP

(57) ABSTRACT

A Group III nitride semiconductor containing: a RAMO$_4$ substrate containing a single crystal represented by the general formula RAMO$_4$ (wherein R represents one or a plurality of trivalent elements selected from the group consisting of Sc, In, Y, and a lanthanoid element, A represents one or a plurality of trivalent elements selected from the group consisting of Fe(III), Ga, and Al, and M represents one or a plurality of divalent elements selected from the group consisting of Mg, Mn, Fe(II), Co, Cu, Zn, and Cd), and a Group III nitride crystal disposed above the RAMO$_4$ substrate, having therebetween a dissimilar film that contains a material different from the RAMO$_4$ substrate, and has plural openings.

17 Claims, 5 Drawing Sheets

(51) Int. Cl.
*H01L 33/00* (2010.01)
*H01L 31/18* (2006.01)

(56) References Cited

U.S. PATENT DOCUMENTS

| | | | | |
|---|---|---|---|---|
| 6,693,021 | B1* | 2/2004 | Motoki | B82Y 20/00 117/84 |
| 6,855,620 | B2* | 2/2005 | Koike | H01L 21/0237 257/190 |
| 6,861,305 | B2* | 3/2005 | Koike | H01L 33/007 257/E21.108 |
| 7,141,444 | B2* | 11/2006 | Koike | H01L 21/0237 257/E21.131 |
| 9,396,941 | B2* | 7/2016 | Hite | H01L 21/0237 |
| 2005/0208687 | A1* | 9/2005 | Kasai | C30B 25/02 438/22 |
| 2008/0087919 | A1* | 4/2008 | Tysoe | C30B 29/403 257/201 |
| 2008/0163814 | A1* | 7/2008 | Kim | H01L 21/0254 117/95 |
| 2009/0197399 | A1 | 8/2009 | Nakamura et al. | |
| 2011/0163323 | A1* | 7/2011 | Motoki | C30B 25/00 257/76 |
| 2012/0199952 | A1* | 8/2012 | D'Evelyn | H01L 21/0237 257/615 |
| 2013/0075785 | A1* | 3/2013 | Ishiguro | H01L 29/66462 257/194 |
| 2013/0244364 | A1 | 9/2013 | Gardner et al. | |
| 2014/0147650 | A1* | 5/2014 | Jiang | H01L 21/0237 428/220 |
| 2014/0217553 | A1* | 8/2014 | Arena | C30B 25/183 257/615 |
| 2014/0357053 | A1* | 12/2014 | Sun | H01L 21/187 438/458 |
| 2015/0115299 | A1 | 4/2015 | Grundmann et al. | |
| 2017/0067182 | A1* | 3/2017 | Shibata | C23C 16/34 |
| 2017/0207307 | A1* | 7/2017 | Dasgupta | H01L 29/2003 |

FOREIGN PATENT DOCUMENTS

| | | |
|---|---|---|
| JP | 11-043398 A | 2/1999 |
| JP | 2009-184836 A | 8/2009 |
| JP | 2013-542608 A | 11/2013 |
| JP | 2013-544436 A | 12/2013 |
| JP | 2014-111527 | 6/2014 |
| JP | 2015-178448 | 10/2015 |

OTHER PUBLICATIONS

Kukushkin et al., "Substrates for Epitaxy of Gallium Nitride: New Materials and Techniques," Dec. 2008, Rev. Adv. Mater. Sci. 17 (2008) pp. 1-32.*

Hellman et al., "ScAlMgO4: an oxide Substrate for GaN Epitaxy", Jan. 1996, MRS Internet Journal of Nitride Semiconductor Research, vol. 1, Article 1, 11 pages.*

* cited by examiner

US 9,899,564 B2

GROUP III NITRIDE SEMICONDUCTOR AND METHOD FOR PRODUCING SAME

TECHNICAL FIELD

The technical field relates to a Group III nitride semiconductor and a method for producing the same.

BACKGROUND

A method for producing a GaN laser device using an $ScAlMgO_4$ substrate has been known (see, for example, Patent Literature 1). The lattice mismatch ratio of $ScAlMgO_4$ with respect to GaN (((lattice constant of GaN)−(lattice constant of $ScAlMgO_4$))/(lattice constant of GaN)) is −1.9%, which is smaller than the lattice mismatch ratio of a sapphire substrate thereto (+16%). Accordingly, crystal growth of GaN with an $ScAlMgO_4$ substrate as a seed substrate provides a GaN crystal having a smaller defect density than with a sapphire substrate. Patent Literature 1 describes a method, in which an amorphous or polycrystalline buffer layer is formed on an $ScAlMgO_4$ substrate at a low temperature of approximately 600° C., and then a GaN single crystal thin film is formed by a metal-organic chemical vapor deposition method (which may be hereinafter referred to as an MOCVD method) at a high temperature of 1,050° C.

Patent Literature 2 describes a method, in which a mask is formed on a partial region of a dissimilar substrate, such as a sapphire substrate, different from GaN, and a GaN crystal is grown on the mask selectively in the lateral direction. In the Patent Literature 2, a GaN crystal is grown on a sapphire substrate and an $ScAlMgO_4$ substrate by an ammonothermal lateral epitaxial growth method at a temperature of approximately from 650 to 690° C.

Patent Literature 1: JP-A-2015-178448
Patent Literature 2: JP-A-2014-111527

However, both the techniques of Patent Literatures 1 and 2 have a problem of mismatch in lattice constant, which causes a stress concentration at the interface between the grown crystal and the seed substrate. The stress concentration at the interface may be a factor causing deterioration of the crystal quality, such as an inclination of the crystal axis and occurrence of warpage. Accordingly, there has been a demand of providing a Group III nitride semiconductor containing a Group III nitride crystal having better quality than the ordinary products, and a demand of providing a production method therefor.

SUMMARY

In view of the above problems, as well as other concerns, an object herein is to provide a Group III nitride semiconductor having high quality, and a method for producing the same.

Accordingly, as one aspect, a Group III nitride semiconductor contains: a $RAMO_4$ substrate containing a single crystal represented by the general formula $RAMO_4$ (wherein R represents one or a plurality of trivalent elements selected from the group consisting of Sc, In, Y, and a lanthanoid element, A represents one or a plurality of trivalent elements selected from the group consisting of Fe(III), Ga, and Al, and M represents one or a plurality of divalent elements selected from the group consisting of Mg, Mn, Fe(II), Co, Cu, Zn, and Cd); a dissimilar film that is formed on the $RAMO_4$ substrate, contains a material different from the $RAMO_4$ substrate, and has plural openings; and a Group III nitride crystal that is formed on the dissimilar film and in the openings of the dissimilar film, contains a material different from the dissimilar film, and contains an element represented by M in the general formula.

According to the aspect, a Group III nitride semiconductor having high quality, and a method for producing the same can be provided.

DESCRIPTION OF EMBODIMENTS

Embodiments of the aspect will be described with reference to the drawings.

EMBODIMENTS

Figure 3:
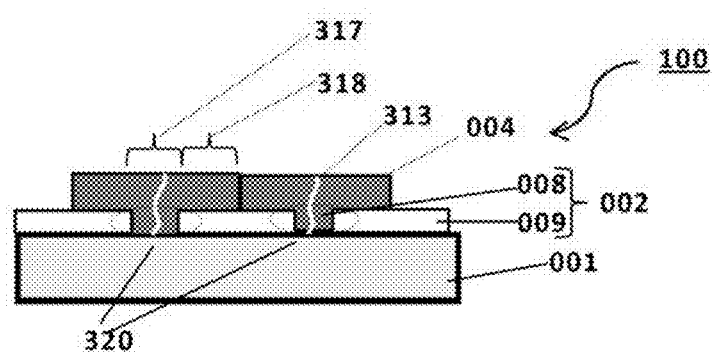
FIG. 3 is a cross sectional view showing a Group III nitride semiconductor according to one embodiment.

FIG. 3 shows a Group III nitride semiconductor 100 according to one embodiment. The Group III nitride semiconductor 100 contains a $RAMO_4$ substrate 001 containing a substantially single crystal represented by the general formula $RAMO_4$, and a Group III nitride crystal 004 is laminated on the $RAMO_4$ substrate 001 through a dissimilar film 002. In the embodiment, in the production of the Group III nitride semiconductor, a part of the Group III nitride crystal 004 is epitaxially grown on the $RAMO_4$ substrate 001 as a seed substrate. In the general formula, R represents one or a plurality of trivalent elements selected from Sc, In, Y, and a lanthanoid element (atomic number: 67 to 71), A represents one or a plurality of trivalent elements selected from Fe(III), Ga, and Al, and M represents one or a plurality of divalent elements selected from Mg, Mn, Fe(II), Co, Cu, Zn, and Cd. The substantially single crystal of $RAMO_4$ means a crystalline solid, in which the crystalline solid contains 90% by atom or more of the structure represented by $RAMO_4$ constituting a surface, on which a Group III nitride is epitaxially grown (i.e., an epitaxial growth surface), and in terms of an arbitrary crystal axis, the direction of the crystal axis is not changed in any part on the epitaxial growth surface. However, a crystalline solid having a crystal axis that is locally changed in direction thereof and a crystalline solid containing local lattice defects are handled as a single crystal material. In the general formula, O represents oxygen. In the general formula, it is preferred that R is Sc, A is Al, and M is Mg.

The Group III element constituting the Group III nitride crystal is most preferably gallium (Ga), and may be, for example, aluminum (Al), indium (In), thallium (Tl), or the like. The Group III nitride crystal in the embodiment contains an element represented by M in the general formula. It is not necessary that the entire Group III nitride crystal contains an element represented by M, but it suffices that a part thereof contains the element.

The following description shows the case where R in the general formula is Sc, A therein is Al, and M therein is Mg, i.e., $RAMO_4$ is $ScAlMgO_4$, and the Group III nitride is GaN, but the aspect herein is not limited to the case.

As described above, the Group III nitride semiconductor 100 of the embodiment has an $ScAlMgO_4$ substrate 001 containing an $ScAlMgO_4$ single crystal (see FIG. 3). On the $ScAlMgO_4$ substrate 001, a dissimilar film (which may be hereinafter referred to as a "mask layer") 002 that contains a material different from the $ScAlMgO_4$ substrate 001 and has plural openings 008 is disposed. The mask layer 002 contains plural protrusions 009 covering the $ScAlMgO_4$ substrate 001, and plural openings 008, in which the $ScAlMgO_4$ substrate 001 is exposed, formed among the protrusions 009. On the mask layer 002, a GaN crystal 004 that contains a material different from the mask layer 002 is disposed.

In the Group III nitride semiconductor 100 of the embodiment, the GaN crystal 004 is formed on the $ScAlMgO_4$ substrate 001 through the mask layer 002, and therefore the GaN crystal 004 having high quality can be formed even with the use of the $ScAlMgO_4$ substrate 001 as a seed substrate.

The mask layer 002 is preferably in direct contact with the $ScAlMgO_4$ substrate 001. In the case where the mask layer 002 is in contact with $ScAlMgO_4$ substrate 001, GaN can be epitaxially grown in the opening 008 of the mask layer 002 with the $ScAlMgO_4$ substrate 001 as a seed substrate.

The protrusion 009 of the mask layer 002 is preferably constituted by a dielectric material or a metal. In the case where the protrusion 009 is constituted by a dielectric material or a metal, GaN can be selectively grown in the vapor phase epitaxial method of GaN, and thereby a GaN crystal having high quality can be obtained.

Specific examples of the dielectric material constituting the protrusion 009 of the mask layer 002 include silicon nitride, silicon oxide, silicon oxynitride, aluminum oxide, aluminum oxynitride, titanium oxide, zirconium oxide, and niobium oxide, which may be used solely or as a combination of two or more kinds thereof.

In particular, the protrusion 009 of the mask layer 002 is preferably constituted by a high melting point metal or a high melting point metal compound. While crystal growth at a high temperature (for example, approximately 1,000° C.) is generally performed in the vapor phase epitaxial method, such as MOCVD, for forming the GaN crystal 004, the high melting point metal or the high melting point metal compound is difficult to be decomposed under the high temperature atmosphere and difficult to form an impurity. Specific examples of the high melting point metal or the high melting point metal compound include tungsten, molybdenum, niobium, tungsten silicide, molybdenum silicide, and niobium silicide, which may be used solely or as a combination of two or more kinds thereof.

The thickness of the protrusion 009 of the mask layer 002 is preferably 10 nm or more and 100 nm or less. When a region thinner than 10 nm is contained, the selective growth of GaN may be difficult to be performed in some cases. When the thickness of the protrusion 009 is larger than 100 nm, on the other hand, a void or a defect may be formed in the region in contact with the protrusion 009 in the lateral growth of the GaN crystal 004, which may deteriorate the quality of the GaN crystal 004 in some cases.

The protrusion 009 preferably has a large width. When the protrusion 009 has a large width, the area of the GaN crystal 004 having less defects formed on the protrusion 009 can be sufficiently large. Specifically, the width of the protrusion 009 is preferably 3 µm or more and 30 µm or less.

The opening 008 preferably has a width of 1 µm or more and 100 µm or less. When the width of the opening 008 is too large, the width of the protrusion 009 becomes relatively small, and the area of the GaN crystal 004 having less defects formed on the protrusion 009 may be decreased. When the width of the opening 008 is too small, on the other hand, a GaN crystal having a sufficient size may be difficult to be formed within the opening 008.

The shape of the protrusion 009 is not particularly limited as long as the mask layer 002 has the plural openings 008, and may be, for example, a stripe shape or other shapes. The shape of the opening 008 is also not particularly limited, and may be, for example, a stripe shape or a dot shape. The openings 008 are preferably formed periodically among the protrusions 009.

The GaN crystal 004 is preferably in direct contact with the $ScAlMgO_4$ substrate 001 through the plural openings 008. When they are in direct contact with each other, GaN can be epitaxially grown with the $ScAlMgO_4$ substrate 001 as a seed substrate. In the embodiment, the GaN crystal 004 and the $ScAlMgO_4$ substrate 001 are in contact with each other only partially due to the presence of the mask (i.e., the protrusions 009) formed partially. Accordingly, the stress formed at the interface therebetween can be reduced as compared to the case where they are in contact with each other over the entire surface. Consequently, warpage is difficult to occur in the GaN crystal 004, and the formation of defects at the interface is also suppressed. The GaN crystal 004 thus obtained can be a template for a Group III nitride crystal having higher quality.

A method for producing a Group III nitride semiconductor 100 according to one embodiment will be described with reference to FIGS. 1A-1H.

Figure 1A:
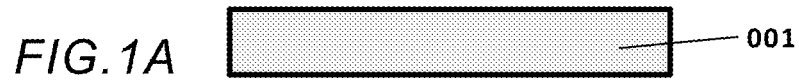
FIGS. 1A-1H are cross sectional views showing process steps of a Group III nitride semiconductor in one embodiment.
Figure 1B:
Figure 1C:
Figure 1D:
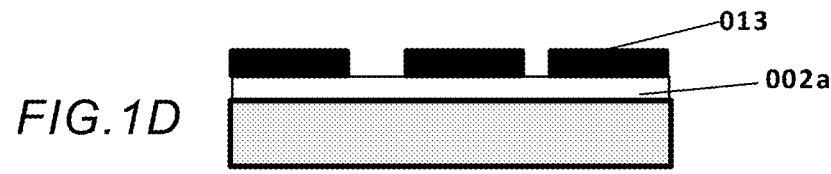
Figure 1E:
Figure 1F:
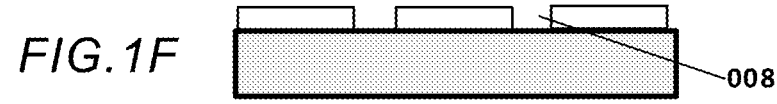

A step of preparing an $ScAlMgO_4$ substrate 001 as a single crystal is performed (FIG. 1A). Subsequently, a step of accumulating a layer 002a formed of a material for a mask layer, on the $ScAlMgO_4$ substrate 001 is performed (FIG. 1B). Then, a step of coating a resist film 003 on the upper surface of the layer 002a (FIG. 1C), and patterning the coated resist film to a stripe shape by a photolithography method (FIG. 1D) is performed. Accordingly, a resist pattern 013 is formed on the layer 002a.

Thereafter, a step of removing a part of the layer 002a by etching (FIG. 1E), and a step of removing the remaining resist pattern 013 (FIG. 1F) are performed. Accordingly, a mask layer 002 having plural protrusions 009, a stripe shape and plural openings 008 is formed. The etching method is not particularly limited, and for example, dry etching or the like may be used. The mask layer 002 in the embodiment has a repeating pattern having openings 008 each having a cross sectional width of approximately 3 µm and protrusions 009 each having a cross sectional width of approximately 12 vim.

Figure 1G:
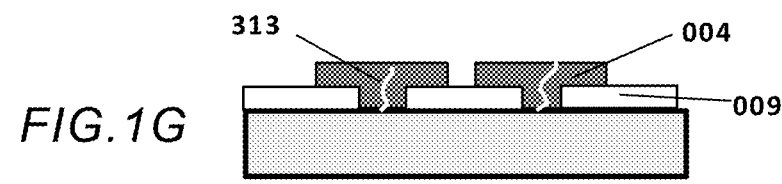
Figure 1H:
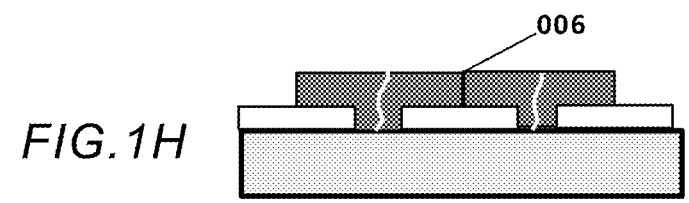

Subsequently, a step of forming a GaN crystal 004 on the mask layer 002 is performed (FIG. 1G and FIG. 1H). Examples of the method for forming the GaN crystal 004 include a metal-organic chemical vapor deposition method (which may be hereinafter referred to as an MOCVD method). In the MOCVD method, crystal growth of GaN is performed in a high temperature atmosphere of approximately from 900 to 1,000° C. In the embodiment, trimethylgallium (TMGa) and ammonia are used as raw materials. A mixed gas of hydrogen and nitrogen is used as a carrier gas. In a strict sense in this step, crystals of GaN are grown from the portions of the ScAlMgO₄ substrate 001 as an origin exposed in the plural openings 008 of the mask layer 002 respectively. Thus, the GaN crystal 004 is grown in direct contact in a manner as being in direct contact with the upper surface of the ScAlMgO₄ substrate 001. As the crystal growth proceeds, the GaN crystal 004 becomes in direct contact with the upper surface of the protrusion 009 of the mask layer 002. As the GaN crystal 004 is further grown, the GaN crystal 004 is extended in the lateral direction (plane direction) on the upper surface of the protrusion 009 of the mask layer 002. According to the process, plural GaN crystals 004 each having a thin film structure are formed (FIG. 1G).

As the plural GaN crystals 004 each having a thin film structure are further grown, the adjacent GaN crystals 004 are then bonded to each other at a bonding position 006 at the approximate center of the protrusion 009, and thus are integrated with each other (FIG. 1H). According to the process, the GaN crystal 004 formed of a single crystal is formed on the ScAlMgO₄ substrate 001, and thereby a GaN semiconductor having the GaN crystal 004 having high quality is thus produced.

The factor in the formation of the Group III nitride crystal having high quality of the Group III nitride semiconductor produced in the embodiment will be described.

As described above, the lattice constant of GaN is smaller than ScAlMgO₄. Accordingly, a lattice mismatch ratio of −1.9% occurs between the ScAlMgO₄ substrate 001 and the GaN crystal 004, with which defects 313 (threading dislocation) are formed in the GaN crystal 004 formed in the vicinity of the interface therebetween. The defects 313 propagate in the direction substantially in parallel to the growth direction of the GaN crystal 004. Accordingly, as in the embodiment, the defects 313 are concentrated around the opening 008 of the mask layer 002 in the crystal growth of GaN. On the other hand, the dislocations, which are the defects 313, are difficult to propagate in the GaN crystal 004 that is grown laterally on the protrusion 009 of the mask layer 002. Consequently, the defects 313 can be concentrated locally around the opening 008 of the mask layer 002, and a crystal having high quality with less defects 313 can be obtained in the area except for that region.

In the case where GaN is heteroepitaxially grown on sapphire as a seed substrate, it is difficult to prevent the propagation of a dislocation even through a mask layer is formed on the sapphire substrate as a seed substrate, and a crystal of GaN is grown thereon as in this embodiment, due to the large absolute value of the lattice mismatch ratio between sapphire and GaN of 16%. Therefore, in the case where sapphire or the like is used as a seed substrate, it may be necessary to provide a low temperature buffer layer, such as amorphous AlN, between the substrate and the mask layer.

In the embodiment using the ScAlMgO₄ substrate as a seed substrate, on the other hand, a crystal having high quality can be produced as described above even through the mask layer 002 is formed directly on the ScAlMgO₄ substrate 001. Thus, a low temperature buffer layer, such as amorphous AlN, may not be necessarily provided in the heteroepitaxial growth of GaN (Group III nitride crystal), and thus GaN (Group III nitride) having higher quality can be efficiently formed.

The technical significance of the method for producing a Group III nitride semiconductor of the embodiment will be described in more detail with reference to FIG. 3. In the production method of the embodiment, as described above, the mask layer 002 having plural openings 008 is formed on the ScAlMgO₄ substrate 001. The GaN crystal 004 is then grown from the ScAlMgO₄ substrate 001 as an origin that is exposed in the plural openings 008 of the mask layer 002. In the growth of the GaN crystal 004, plural minute GaN crystals 004 each are grown selectively in the lateral direction, and the adjacent GaN crystals 004 are then integrated with each other around the approximate center of the protrusion 009. In the growth of the GaN crystal 004, furthermore, the flat crystal surface is grown in the c-axis direction. The surface of the GaN crystal 004 (on the opposite side to the ScAlMgO₄ substrate 001) is the c-plane. The thickness of the GaN crystal 004 may be, for example, 5 μm.

In the GaN crystal 004 obtained by the production method of the embodiment, as described above, the defects 313 are concentrated to the center regions of the plural openings 008 to form regions 317 having many defects. On the other hand, regions 318 having less defects are formed on the protrusions 009 of the mask layer 002. The regions 318 having less defects can be smoothly integrated with each other without warpage and inclination since the regions receive less influence of the lattice mismatch between the ScAlMgO₄ substrate 001 and the GaN crystal 004. Accordingly, substantially no new defect occurs in the regions 318. Consequently, the dislocation density of the GaN crystal 004 can be $1 \times 10^6$ m$^{-2}$ or less in the region except for the vicinity of the opening 008 of the mask layer 002.

Figure 4:
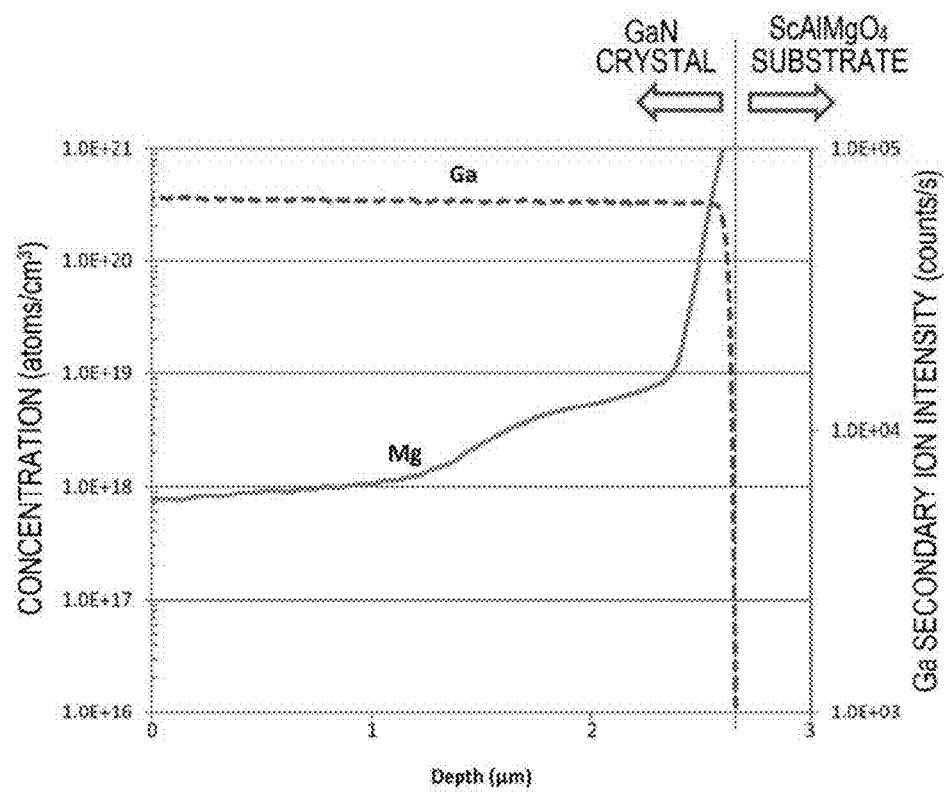
FIG. 4 is a graph showing a profile obtained by measuring element concentrations in a Group III nitride crystal in one embodiment by secondary ion mass spectroscopy.

In the crystal growth of GaN by an MOCVD method under a high temperature atmosphere of from 900 to 1,000° C., Mg atoms in the ScAlMgO₄ substrate 001 are partially decomposed and evaporated, and are diffused into the GaN crystal 004. For the ScAlMgO₄ substrate 001 around the opening 008 of the mask layer 002 (i.e., the region 320 in FIG. 3) and the GaN crystal 004 in the opening 008, the Mg concentration profile in the depth direction is measured by secondary ion mass spectroscopy (SIMS), and the result is shown in FIG. 4. As shown in FIG. 4, the Mg concentration of the GaN crystal 004 in the opening 008 (i.e., the Mg concentration in the region 317 in FIG. 3) is $7 \times 10^{17}$ (atoms/cm³) or more, from which it is understood that the GaN crystal 004 contains Mg. As shown in FIG. 4, furthermore, the Mg concentration increases as approaching the ScAlMgO₄ substrate 001, from which it can be said that Mg atoms are diffused from the ScAlMgO₄ substrate 001. In the case where the Mg concentration of the GaN crystal 004 in the opening 008 exceeds $5 \times 10^{21}$ (atoms/cm³), the lattice constant is increased as a result of calculation, but the Mg concentration substituting the Group III element exceeds 10% of the total constitutional atoms of the Group III nitride crystal, and a problem of deterioration in the crystal quality of the Group III nitride semiconductor itself may occur. Therefore, the Mg concentration is preferably from $7 \times 10^{17}$ to $5 \times 10^{21}$ (atoms/cm³).

The Mg concentration is measured similarly for the GaN crystal 004 that is formed on the protrusion 009 of the mask layer 002 (i.e., the region 318 in FIG. 3). As a result, the GaN crystal 004 does not contain Mg atoms, and substantially no diffusion of Mg atoms is observed.

In the case where the GaN crystal 004 in the region 317 contains Mg atoms in a certain extent (for example, from $7 \times 10^{17}$ to $5 \times 10^{21}$ (atoms/cm³)), the lattice constant of the GaN crystal 004 formed in the region is increased. As a result, the lattice constant of the GaN crystal 004 becomes closer to the lattice constant of the ScAlMgO₄ substrate 001, so as to reduce the stress at the interface between the GaN crystal 004 and the ScAlMgO₄ substrate 001, and the inclination of the crystal axis and the warpage are reduced. Consequently, by using an MOCVD method, in which a crystal is grown at a high temperature, as in the embodiment, the GaN crystal 004 having less inclination of the crystal axis and less warpage can be formed on the region 317.

Figure 5:
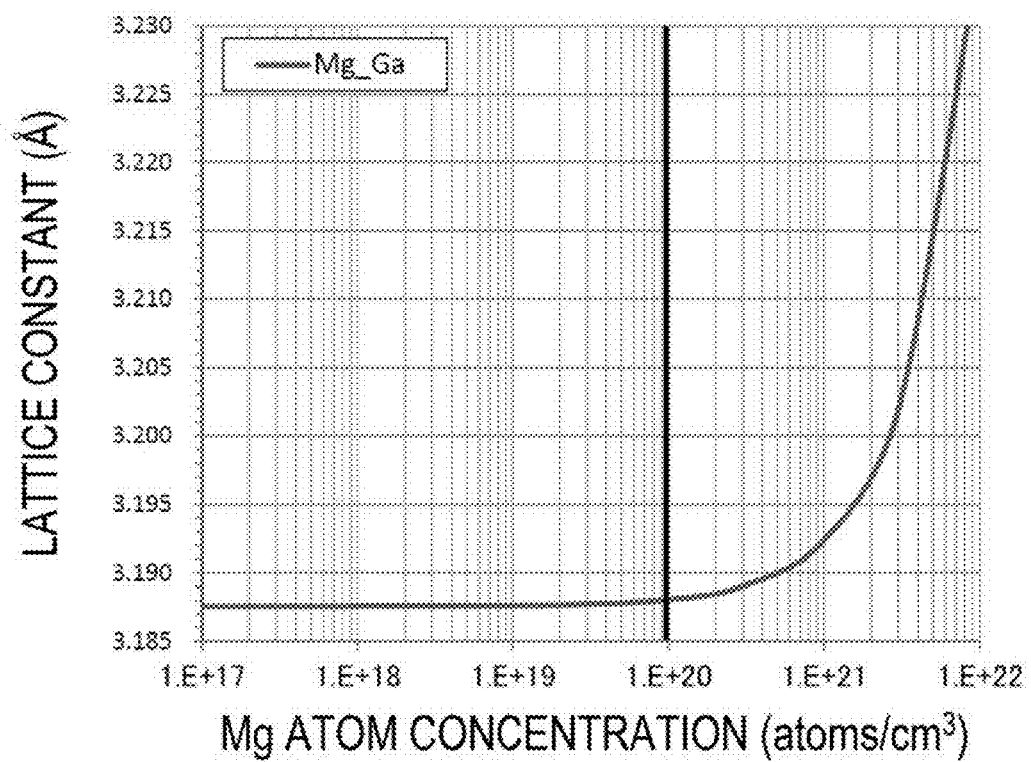
FIG. 5 is a graph showing a dependency of a lattice constant (a-axis lattice constant) on an Mg atom concentration in the case where GaN is doped with Mg.

The Mg concentration of the GaN crystal 004 in the opening 008 is more preferably from $1 \times 10^{20}$ to $5 \times 10^{21}$ (atoms/cm$^3$). The factor thereof will be described with reference to the graph illustrated in FIG. 5 showing the dependency of the lattice constant (a-axis lattice constant) on the Mg atom concentration in the case where GaN is doped with Mg. The graph has been obtained herein by calculating the average lattice constant based on the value of the bond length between Ga and Mg in the case where the Ga atom positions in a GaN crystal are replaced by Mg. In the calculation of the bond length between Ga and N, the charge of Ga in the Ga site in the GaN crystal is assumed to be 0 (neutral). The lattice constant in the graph is the lattice constant within the c-plane for the crystal growth, i.e., the (0001) plane, (which is the lattice constant in the direction perpendicular to the c-axis). It is understood from the graph that the lattice constant of GaN is drastically increased when the Mg concentration in the GaN crystal becomes $1 \times 10^{20}$ (atoms/cm$^3$) or more. Accordingly, with the Mg concentration of the GaN crystal 004 of from $1 \times 10^{20}$ to $5 \times 10^{21}$ (atoms/cm$^3$), a Group III nitride having good crystal quality can be obtained while decreasing the difference in lattice constant between the seed substrate and the Group III nitride crystal formed thereon.

In the GaN crystal in the region 317, the dislocations (defects 313) formed from the interface to the ScAlMgO$_4$ substrate 001 are concentrated, and the diffusion of Mg atoms is accelerated through the dislocations. According to the mechanism, the GaN crystal 004 in the entire region in contact with the ScAlMgO$_4$ substrate 001 has a larger lattice constant than the other regions. The GaN crystal 004 having such a structure is difficult to suffer warpage even through growing to a larger thickness.

On the other hand, the diffusion of Mg is difficult to occur in the other regions than the region 317 in FIG. 3, such as the region 318 adjacent to the region 317. Accordingly, the Mg content in the regions is substantially zero. This may be also evidenced, for example, by Japanese Journal of Applied Physics, No. 44 (2005), pp. 6495-6504, reporting that the diffusion coefficient with no dislocation is decreased by approximately three orders, as compared to the case with dislocations. Therefore, it can be understood that there is substantially no diffusion of Mg occurring in the GaN crystal 004 adjacent to the region 317 (i.e., the GaN crystal in the regions other than the region 317).

In the case where the GaN crystal 004 having Mg diffused therein is further subjected to crystal growth, the dislocations are converged to suppress the diffusion of Mg atoms gradually. The crystal then becomes closer to the GaN template having a uniform lattice constant. Thus, the Mg concentration of the GaN crystal 004 in the region 317 in FIG. 3 is larger on the side of the ScAlMgO$_4$ substrate, whereas the Mg concentration thereof on the opposite surface is smaller.

Based on the aforementioned mechanism, the production of a Group III nitride semiconductor by the production method of the embodiment enables incorporation of divalent atoms contained in a RAMO$_4$ substrate (which are Mg atoms in the ScAlMgO$_4$ substrate in the embodiment) into a part of a Group III nitride crystal (GaN crystal). The Group III nitride crystal that contains divalent atoms in a part thereof has a lattice constant close to that of the RAMO$_4$ substrate, and has less inclination of the crystal axis and less warpage. Furthermore, by growing a crystal on the Group III nitride crystal that contains divalent atoms in a part thereof as a template, a Group III nitride semiconductor having a Group III nitride crystal having high quality can be obtained.

In the known ammonothermal lateral epitaxial growth, the temperature, at which a GaN crystal is grown, is as low as approximately from 650 to 690° C. Therefore, even though a GaN crystal is grown with an ScAlMgO$_4$ substrate, Mg atoms are substantially not diffused in the GaN crystal 004. The calculation of the diffusion coefficient, for example, by the activation energy of Mg diffusion in GaN described in Solid-State Electronics, vol. 43 (1999), pp. 621-623, shows that the diffusion coefficient of Mg in the growth of GaN by an ammonothermal method is smaller by approximately from 10 to 30 orders than the diffusion coefficient of Mg in the growth of GaN by an MOCVD method. Thus, substantially no diffusion of Mg occurs in the case where a GaN crystal is grown by an ammonothermal method. Therefore, a GaN crystal that is grown by the ammonothermal lateral epitaxial growth contains substantially no Mg.

The dislocation density of the GaN crystal in the region 318 can be $1 \times 10^6$ m$^{-2}$ by producing the GaN crystal by the aforementioned method, but when a GaN crystal is grown without the mask layer 002 provided, the dislocation density of the GaN crystal (having a thickness of approximately 2 μm) becomes approximately from 3 to $5 \times 10^7$ cm$^{-2}$. When GaN is epitaxially grown on a sapphire substrate as a seed substrate instead of the ScAlMgO$_4$ substrate, the dislocation density of the GaN crystal thus grown is further increased by approximately 1 to 2 orders.

Dislocations of a GaN crystal are incorporated due to the lattice mismatch and the thermal expansion mismatch of the seed substrate to the GaN crystal (Group III nitride crystal) to be grown. Therefore, it is difficult to avoid dislocations completely when heteroepitaxially grown. A dislocation density of GaN exceeding $1 \times 10^7$ cm$^{-2}$ may be insufficient in quality of a substrate for a light emitting diode for an illumination and an automobile headlight, and a laser diode. Accordingly, a GaN crystal having a dislocation density of $1 \times 10^6$ m$^{-2}$ or less is demanded in practical use, and the Group III nitride semiconductor according to the embodiment can satisfy the demand.

MODIFIED EMBODIMENTS

Figure 2:
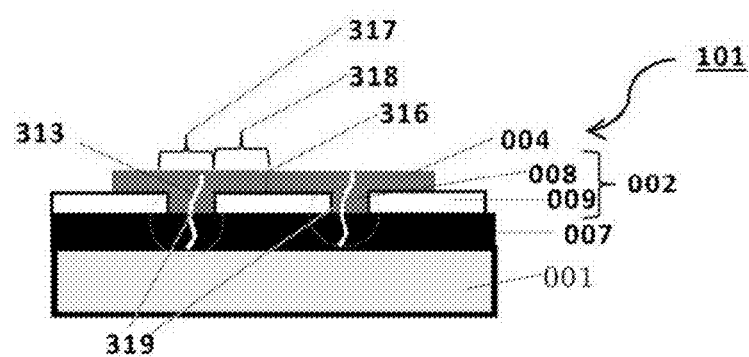
FIG. 2 is a cross sectional view showing a Group III nitride semiconductor according to a modified example in one embodiment.

The Group III nitride semiconductor of another embodiment may have an Al$_x$Ga$_{1-x}$N layer 007 (0≤x<1) between the ScAlMgO$_4$ substrate 001 and the GaN crystal 004, a shown in FIG. 2. FIG. 2 is a schematic cross sectional view showing a Group III nitride semiconductor 101 according to a modified embodiment of the aspect.

The Al$_x$Ga$_{1-x}$N layer 007 may be formed, for example, by the following method. Herein, the thickness of the Al$_x$Ga$_{1-x}$N layer 007 is 2 and the content x of Al is 0.02 (2% by atom).

An ScAlMgO$_4$ substrate 001 as a seed substrate is prepared. The substrate thus prepared is subjected to thermal cleaning in a hydrogen atmosphere at approximately 1,000° C., and a buffer layer is then formed to a thickness of approximately from 20 to 50 nm at a low temperature of approximately 600° C. An Al$_x$Ga$_{1-x}$N layer 007 is grown at 1,050° C. by an MOCVD method. A crystal having high quality can be obtained due to the presence of the buffer layer. The composition of the buffer layer is preferably the same as the Al$_x$Ga$_{1-x}$N layer 007.

The content of Al in the Al$_x$Ga$_{1-x}$N layer 007 may be 2% by atom or more and 10% by atom or less since no problem may occur as the lattice constant thereof is not too remote from GaN. After forming the $Al_xGa_{1-x}N$ layer 007, the mask layer 002 described in the aforementioned embodiment is formed. While the mask layer 002 in this modified embodiment is formed to have openings 008 in a stripe shape, the shape of the openings 008 of the mask layer 002 is not limited thereto. While the $ScAlMgO_4$ substrate 001 is directly exposed in the openings 008 of the mask layer 002 in the aforementioned embodiment, the $Al_xGa_{1-x}N$ layer 007 is exposed in the openings 008 of the mask layer 002 in the modified embodiment. In the modified embodiment, the GaN crystal 004 is grown from the exposed $Al_xGa_{1-x}N$ layer 007 as an origin.

In the modified embodiment, defects 313 are also formed in the $Al_xGa_{1-x}N$ layer 007 and the GaN crystal 004 that are formed around the opening 008, but the defects are concentrated only in the vicinity of the opening 008 of the mask layer 002, and do not propagate to the majority of the GaN crystal 004. Accordingly, the GaN crystal 004 formed on the protrusion 009 of the mask layer 002 shows high crystallinity.

In the case where a lattice mismatch and a thermal expansion mismatch are largely present between the seed substrate ($ScAlMgO_4$ substrate 001) and the GaN crystal 004 to be grown, the GaN crystal 004 thus grown may be warped due to the residual stress from failure to bond the crystals smoothly in an atomic layer level at a bonding position 316, thereby resulting in further defects in this region in some cases. The further defects may be scattered out to the peripheral portions associated with the further growth of GaN, and may be finally a factor increasing the dislocation density of the entire GaN crystal 004. On the other hand, by providing the $Al_xGa_{1-x}N$ layer 007 as in the modified embodiment, the influence of the lattice mismatch and the thermal expansion mismatch can be reduced. Consequently, the region 318 having less defects can be formed on the substantially entire surface except for the region 317 having many defects. The dislocation density in the region 318 having less defects may be less than $1\times10^6$ m$^{-2}$.

In the modified embodiment, the effect of increasing the lattice constants of the $Al_xGa_{1-x}N$ layer 007 and the GaN crystal 004 through diffusion of Mg from the $ScAlMgO_4$ substrate 001 thereto is as similar to the aforementioned embodiment. Specifically, Mg atoms are diffused from the $ScAlMgO_4$ substrate 001 to the GaN crystal 004 in the region 319 around the opening 008 of the mask layer 002. As a result, the warpage of the GaN crystal 004 is reduced to provide the GaN crystal 004 having high quality.

Instead of the $Al_xGa_{1-x}N$ layer 007, a layer formed of a mixed crystal $Al_xGa_yIn_{1-x-y}N$ ($0 \leq x < 1$ and $x+y=1$) having In added thereto may be used.

Others

The Group III nitride semiconductor of the aspect can be applied to various purposes. For example, the Group III nitride semiconductor of the aspect can be applied to a substrate and the like of various light emitting devices. In this case, an AlGaInN crystal, which is a light emitting layer of a light emitting diode having a light emission wavelength in a range of ultraviolet to red, and a laser diode, is grown on the Group III nitride crystal by an MOCVD method or the like. The formation of the light emitting layer by using the Group III nitride semiconductor of the aspect reduces the defect density of the light emitting layer. Consequently, the light emitting device can be remarkably improved in light emission efficiency and operation lifetime.

While the aforementioned embodiments describe the production of the GaN crystal by the MOCVD method, the GaN crystal may be produced, for example, by a hydride vapor phase epitaxy (HVPE) method, an oxide vapor phase epitaxy (OVPE) method, or the like. The temperature of the substrate in the crystal growth is approximately 1,000° C. or more in both the HVPE method and the OVPE method, as similar to the MOCVD method, and the diffusion of Mg atoms from the $ScAlMgO_4$ substrate occurs. An independent substrate of GaN may be produced in such a manner that a GaN layer having a thickness of several hundred micrometers to several millimeters is formed by an HVPE method or an OVPE method on the GaN crystal as the Group III nitride semiconductor produced by the MOCVD method, and then the $ScAlMgO_4$ substrate is removed by such a measure as polishing.

While the aforementioned embodiments describe the examples where a GaN crystal is formed as the Group III nitride crystal, the Group III nitride crystal formed in the embodiments is not limited to a GaN crystal. For example, $Al_xGa_{1-x}N$ ($0 \leq x \leq 1$) may be formed at a high temperature of approximately from 900 to 1,000° C. in the similar manner as above. However, the increase of the Al content may decrease the selective growth of the crystal due to AlN polycrystals accumulated on the mask layer 002. Accordingly, the concentration of Al contained in the crystal is preferably more than 0% by atom and 10% by atom or less, and more preferably more than 0% by atom and 5% by atom or less.

After producing a GaN crystal by the aforementioned method, the $ScAlMgO_4$ substrate ($RAMO_4$ substrate) and the dissimilar film are removed to extract the Group III nitride crystal, which may be used as a Group III nitride semiconductor. The $ScAlMgO_4$ substrate ($RAMO_4$ substrate) and the dissimilar film may be removed by grinding, polishing, or the like.

According to the production of a Group III nitride semiconductor by the method of the aspect, a Group III nitride semiconductor is obtained containing a Group III nitride crystal having a region that contains one or a plurality of divalent elements selected from the group consisting of Mg, Mn, Fe(II), Co, Cu, Zn, and Cd, and a region that does not contain the divalent element, in which the regions are distributed alternately within one plane constituting the crystal. The Group III nitride semiconductor contains the region that contains the divalent element, and thus is a Group III nitride semiconductor having high quality that is relieved from the mismatch of the lattice constants of the $RAMO_4$ substrate and the Group III nitride crystal occurring in the production of the Group III nitride crystal. The concentration of the divalent element in the region that contains the divalent element is preferably from $7\times10^{17}$ to $5\times10^{21}$ (atoms/cm$^3$), and more preferably from $1\times10^{20}$ to $5\times10^{21}$ (atoms/cm$^3$). When the divalent element is contained in a concentration within the range, the Group III nitride semiconductor produced may have high quality. As described above, in the case where $ScAlMgO_4$ is used as the substrate for producing the Group III nitride semiconductor, the divalent element is Mg. The Group III nitride crystal in the Group III nitride semiconductor is preferably a GaN crystal.

The Group III nitride semiconductor of the aspect can be applied to a seed substrate for crystal growth of a white LED used for an illumination, an automobile headlight, and the like, and a laser diode.

What is claimed is:
1. A Group III nitride semiconductor comprising:
  a $RAMO_4$ substrate containing a single crystal represented by a general formula $RAMO_4$ (wherein R represents one or a plurality of trivalent elements selected from a group of elements including: Sc, In, Y, and a lanthanoid element, A represents one or a plurality of trivalent elements selected from a group of elements including: Fe(III), Ga, and Al, and M represents one or a plurality of divalent elements selected from a group of elements including: Mg, Mn, Fe(II), Co, Cu, Zn, and Cd);

a dissimilar film that is disposed on the $RAMO_4$ substrate, contains a material different from the $RAMO_4$ substrate, and has plural openings; and a Group III nitride crystal that is disposed on the dissimilar film and in the openings of the dissimilar film, contains a material different from the dissimilar film, and contains an element represented by M in the general formula.

2. The Group III nitride semiconductor according to claim 1, wherein the Group III nitride crystal has a concentration of the element represented by M in the openings of the dissimilar film of from $7\times10^{17}$ to $5\times10^{21}$ (atoms/cm$^3$).

3. The Group III nitride semiconductor according to claim 1, wherein the Group III nitride crystal has a concentration of the element represented by M in the openings of the dissimilar film of from $1\times10^{20}$ to $5\times10^{21}$ (atoms/cm$^3$).

4. The Group III nitride semiconductor according to claim 1, wherein the dissimilar film is in direct contact with the $RAMO_4$ substrate.

5. The Group III nitride semiconductor according to claim 1, wherein the dissimilar film contains a dielectric material or a metal.

6. The Group III nitride semiconductor according to claim 1, wherein the Group III nitride crystal is in direct contact with the $RAMO_4$ substrate through the plural openings of the dissimilar film.

7. The Group III nitride semiconductor according to claim 1, wherein in the general formula, R is Sc, A is Al, and M is Mg.

8. A Group III nitride semiconductor comprising a Group III nitride crystal having a first region that contains one or a plurality of divalent elements selected from a group of elements including: Mg, Mn, Fe(II), Co, Cu, Zn, and Cd, and a second region that does not contain the divalent element, the first and second regions being distributed alternately within one plane constituting the crystal, wherein the first region includes threading dislocations more than the second region.

9. The Group III nitride semiconductor according to claim 8, wherein the first region contains a concentration of the divalent element of from $7\times10^{17}$ to $5\times10^{21}$ (atoms/cm$^3$).

10. The Group III nitride semiconductor according to claim 8, wherein the first region contains a concentration of the divalent element of from $1\times10^{20}$ to $5\times10^{21}$ (atoms/cm$^3$).

11. The Group III nitride semiconductor according to claim 1, wherein the Group III nitride crystal is GaN.

12. A method for producing a Group III nitride semiconductor, comprising:

preparing a $RAMO_4$ substrate containing a single crystal represented by a general formula $RAMO_4$ (wherein R represents one or a plurality of trivalent elements selected from a group consisting of Sc, In, Y, and a lanthanoid element, A represents one or a plurality of trivalent elements selected from a group consisting of Fe(III), Ga, and Al, and M represents one or a plurality of divalent elements selected from a group consisting of Mg, Mn, Fe(II), Co, Cu, Zn, and Cd);

forming a dissimilar film that contains a material different from the $RAMO_4$ substrate, and has plural openings, on the $RAMO_4$ substrate; and forming a Group III nitride crystal that contains a material different from the dissimilar film, on the dissimilar film, at a temperature of from 900 to 1,000° C.

13. The method for producing a Group III nitride semiconductor according to claim 12, wherein the dissimilar film is formed in direct contact with the $RAMO_4$ substrate.

14. The method for producing a Group III nitride semiconductor according to claim 12, wherein the dissimilar film contains a dielectric material or a metal.

15. The method for producing a Group III nitride semiconductor according to claim 12, wherein the Group III nitride crystal is formed in direct contact with the $RAMO_4$ substrate through the plural openings of the dissimilar film.

16. The method for producing a Group III nitride semiconductor according to claim 12, wherein in the general formula, R is Sc, A is Al, and M is Mg.

17. The method for producing a Group III nitride semiconductor according to claim 12, wherein the Group III nitride crystal is GaN.

* * * * *